(12) United States Patent  
Ishiguro et al.

(10) Patent No.: US 9,640,691 B2
(45) Date of Patent: May 2, 2017

(54) SOLAR MODULE AND MANUFACTURING METHOD THEREFOR

(71) Applicant: Sanyo Electric Co., Ltd., Moriguchi, Osaka (JP)

(72) Inventors: Tasuku Ishiguro, Kobe (JP); Yukihiro Yoshimine, Kobe (JP); Tsukasa Kawakami, Kaizuka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 194 days.

(21) Appl. No.: 14/090,309

(22) Filed: Nov. 26, 2013

(65) Prior Publication Data
US 2014/0083499 A1   Mar. 27, 2014

Related U.S. Application Data

(63) Continuation of application No. PCT/JP2012/056848, filed on Mar. 16, 2012.

(30) Foreign Application Priority Data

May 31, 2011   (JP) ................................ 2011-122166

(51) Int. Cl.
H01L 31/00 (2006.01)
H01L 31/042 (2014.01)
H02N 6/00 (2006.01)
H01L 31/05 (2014.01)

(52) U.S. Cl.
CPC .......... *H01L 31/05* (2013.01); *H01L 31/0504* (2013.01); *H01L 31/0508* (2013.01); *H01L 31/0512* (2013.01); *Y02E 10/50* (2013.01)

(58) Field of Classification Search
CPC . H01L 31/02021; H01L 31/048; H01L 31/05; H01L 31/0508; H01L 31/0512; Y02E 10/50
USPC ........................ 136/244, 251, 252, 256, 259
See application file for complete search history.

(56) References Cited

U.S. PATENT DOCUMENTS

2007/0095387 A1* 5/2007 Fujii ................... H01L 31/0512
136/251
2009/0288697 A1  11/2009 Shimizu et al.
2010/0126551 A1   5/2010 Okamoto et al.
(Continued)

FOREIGN PATENT DOCUMENTS

EP    2461367 A2    6/2012
JP    H09-116175 A  5/1997
JP    H11-214733 A  8/1999
(Continued)

*Primary Examiner* — Lindsey Bernier
(74) *Attorney, Agent, or Firm* — Mots Law, PLLC

(57) ABSTRACT

A solar module and manufacturing method for the solar module are provided which are able to reduce problems caused by thermal stress. The solar module (1) includes a solar cell (10), a wiring member (11), and an adhesive layer (12). The wiring member (11) is arranged on a surface of the solar cell (10). The adhesive layer (12) is made of resin. The adhesive layer (12) has wide portions (12a) and narrow portions (12b) along the longitudinal direction of the wiring member (11). The solar module (1) has a region at least to the outside of the narrow portions (12b) in which the wiring member (11) and the surface of the solar cell (10) face each other without an interposing adhesive layer (12).

5 Claims, 7 Drawing Sheets

(56) References Cited

U.S. PATENT DOCUMENTS

2012/0080069 A1\* 4/2012 Ishiguro ............. H01L 31/0508
                                                    136/244
2012/0125396 A1   5/2012 Taira et al.

FOREIGN PATENT DOCUMENTS

| JP | 2002-280591 A | 9/2002 | |
|----|----|----|----|
| JP | 2004-253475 A | 9/2004 | |
| JP | 2007-214533 A | 8/2007 | |
| JP | 2008-147567 A | 6/2008 | |
| JP | 2010-021595 A | 1/2010 | |
| JP | WO 2010122875 A1 \* | 10/2010 | ......... H01L 31/0508 |
| JP | 2011-086964 A | 4/2011 | |
| WO | 2011013814 A2 | 2/2011 | |

\* cited by examiner

SOLAR MODULE AND MANUFACTURING METHOD THEREFOR

CROSS-REFERENCE TO RELATED APPLICATIONS

This is a continuation of International Application PCT/JP2012/056848, with an international filing date of Mar. 16, 2012, filed by applicant, the disclosure of which is hereby incorporated by reference in its entirety.

FIELD OF THE INVENTION

The present invention relates to a solar module and to a manufacturing method therefore.

BACKGROUND

Interest in solar modules has increased in recent years as an energy source with a low environmental impact. Solar modules include a plurality of solar cells connected electrically by a wiring member.

Conventionally, the wiring member is bonded to a solar cell using solder exclusively. However, when a wiring member and a solar cell are bonded using solder, the temperature of the solar cell tends to rise in the bonding step. The difference in the thermal expansion coefficient of the wiring material and the solar cell subjects the solar cell to thermal stress, and defects are more likely to occur such as warping, breaking, or cracking of the solar cell. Therefore, in recent years, as proposed, for example, in Patent Document 1 below, it has been proposed for wiring members and solar cells to be bonded using an adhesive resin able to bond the components at a temperature lower than that of solder. This method suppresses defects such as warping, breaking, and cracking of solar cells as compared to a method using solder.

PRIOR ART DOCUMENTS

Patent Documents

Patent Document 1: Laid-Open Patent Publication No. 2010-21595

SUMMARY

Problem Solved by the Invention

However, recent attempts have been made to further reduce the thickness of solar cells in order to make more efficient use of resources. As a result, there is demand for a further reduction in problems in solar cells caused by thermal stress such as warping, breaking, and cracking.

In view of this situation, it is a purpose of the present invention to provide a solar module and a manufacturing method for a solar module which are able to reduce problems caused by thermal stress.

Means of Solving the Problem

The solar module of the present invention includes a solar cell, a wiring member, and an adhesive layer. The wiring member is arranged on a surface of the solar cell. The adhesive layer is arranged between the wiring member and the surface of the solar cell. The adhesive layer is made of resin. The adhesive layer has wide portions and narrow portions along the longitudinal direction of the wiring member. The solar module of the present invention has a region at least to the outside of the narrow portions in which the wiring member and the surface of the solar cell face each other without an interposing adhesive layer.

The manufacturing method for a solar cell in the present invention is a manufacturing method for a solar cell which has a step for connecting a wiring member to a surface of the solar cell. The step of connecting the wiring member to the surface of the solar cell includes the steps of: applying a paste-like resin adhesive to the surface of the solar cell so as to have wide portions and narrow portions along one direction; arranging the wiring member, the longitudinal direction of which is the one direction, so as to extend over the wide portions and the narrow portions; and applying relative pressure onto the wiring member towards the solar cell, and heating the wiring member to cure the resin adhesive and bond the wiring member to the surface of the solar cell. The resin adhesive is applied so that the width of the narrow portions is narrower than the width of the wiring member.

Effect of the Invention

The present invention is able to provide a solar module and a manufacturing method for a solar module which are able to reduce problems caused by thermal stress.

DETAILED DESCRIPTION

Figure 1:
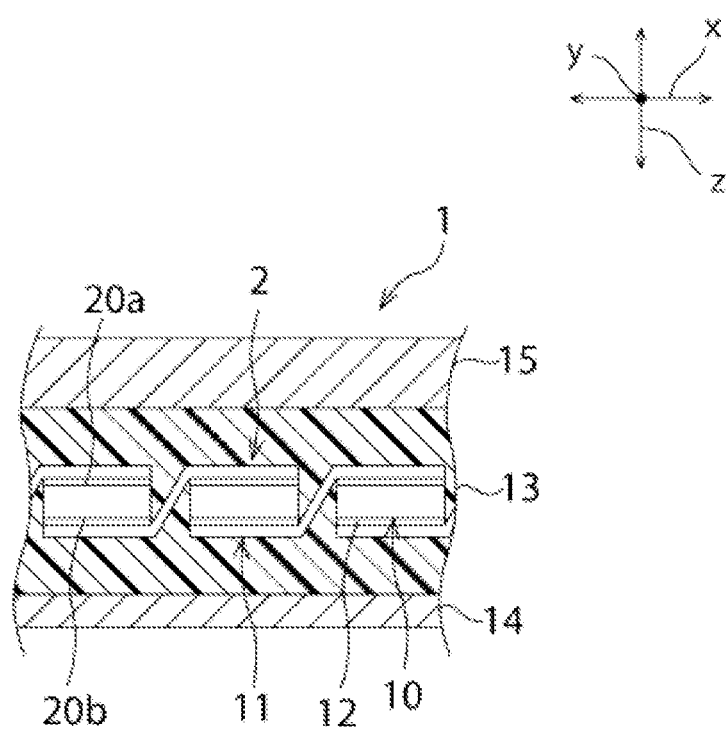
FIG. 1 is a simplified cross-sectional view of the solar module in a first embodiment.

The following is an explanation of examples of preferred embodiments of the present invention. The following embodiments are merely examples. The present invention is not limited to the following embodiments in any way.

Further, in each of the drawings referenced in the embodiments, members having substantially the same function are denoted by the same symbols. The drawings referenced in the embodiments are also depicted schematically. The dimensional ratios of the objects depicted in the drawings may differ from those of the actual objects. The dimensional ratios of objects may also vary between drawings. The specific dimensional ratios of the objects should be determined with reference to the following explanation.

1st Embodiment

Figure 2:
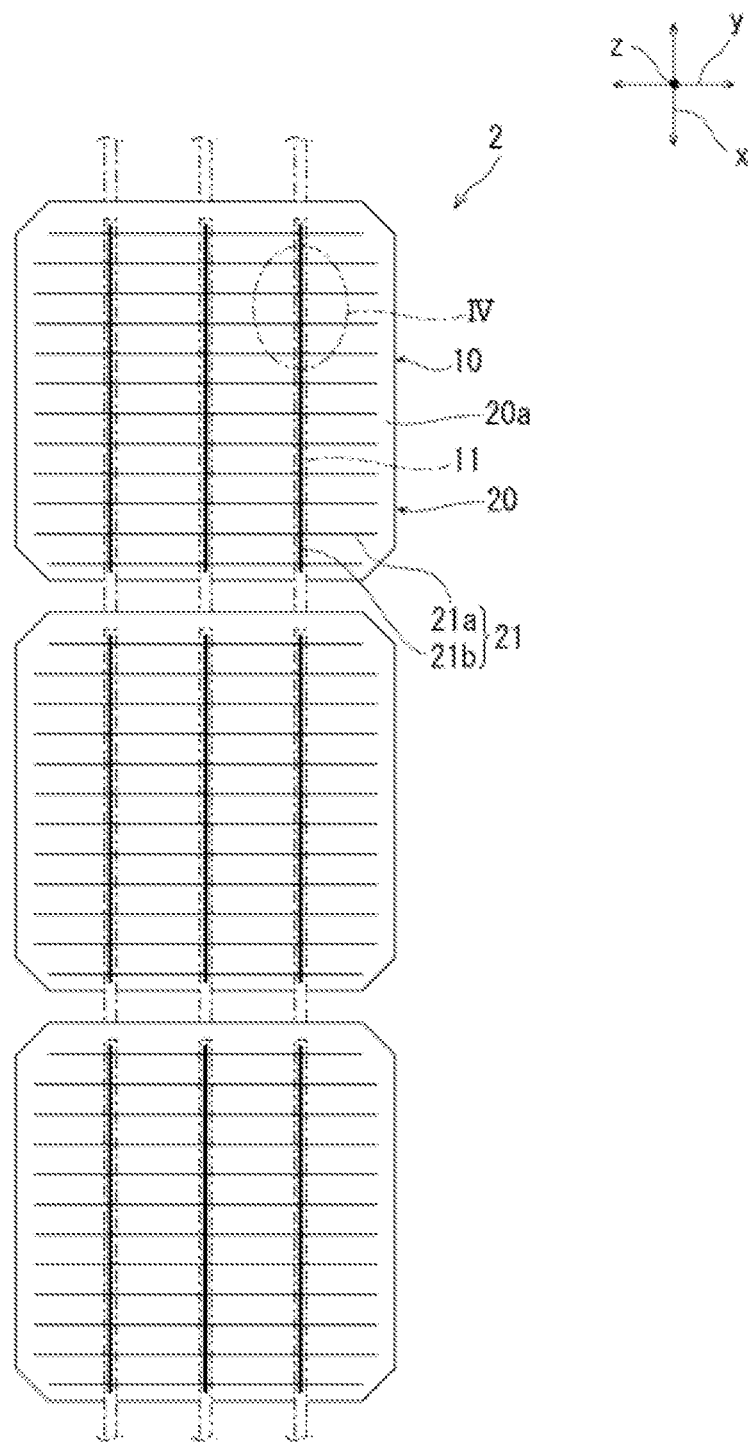
FIG. 2 is a simplified plan view of a solar cell string in the first embodiment.
Figure 3:
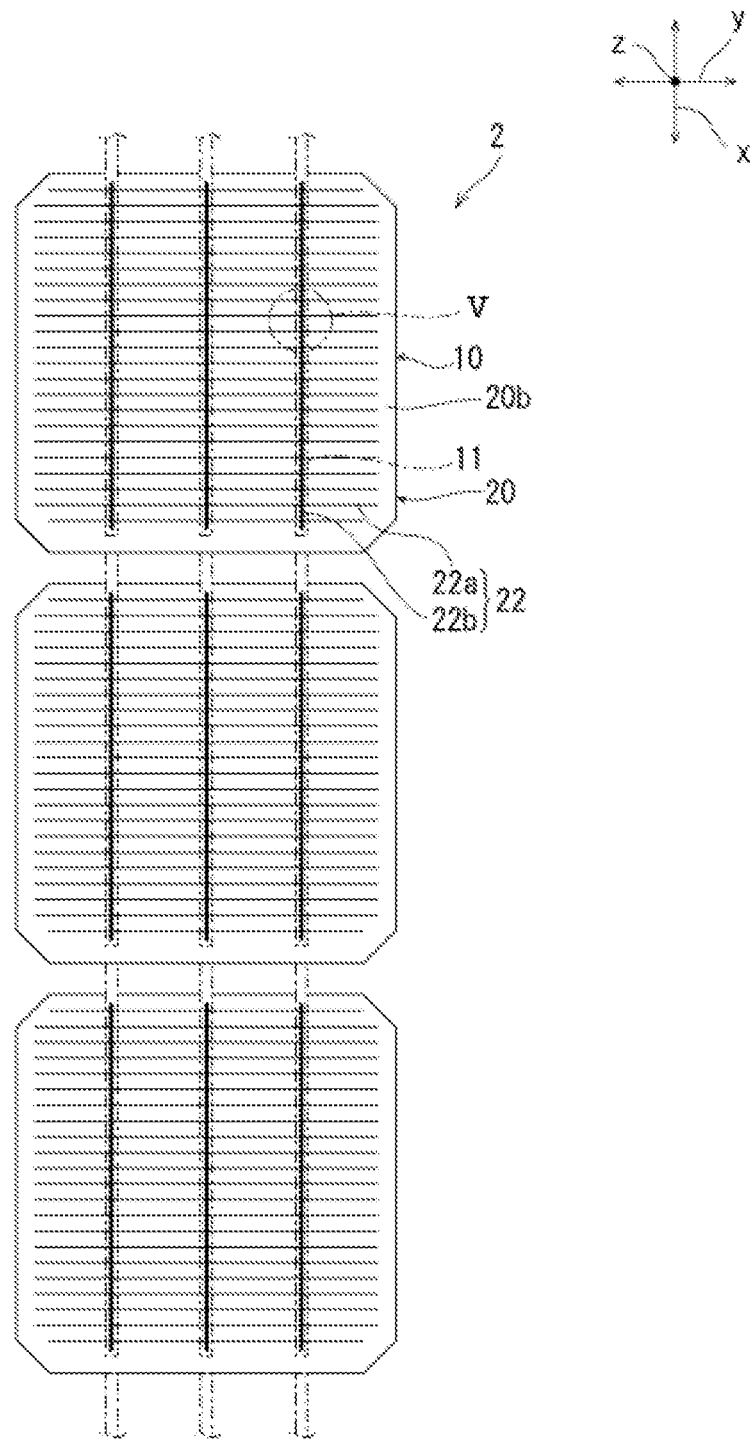
FIG. 3 is a simplified back view of a solar cell string in the first embodiment.

As shown in FIG. 1 through FIG. 3, the solar module 1 in the present embodiment includes a first protecting member 15, a second protecting member 14, and a plurality of solar cells 10. The solar cells 10 are sealed in a sealing material 13 between the second protecting member 14 and the first protecting member 15. The solar module 1 may also have a terminal box on the surface of the second protecting member 14 to extract the electrical power generated by the solar cells 10. The solar module 1 may also have a metal or resin frame on the peripheral edges.

The first protecting member 15 has transparent properties and is used to protect the light-receiving surface of the solar cells 10. The first protecting member 15 can be a plate with transparent properties such as a glass plate or a transparent plastic plate. The light incident on the solar module 1 passes through the first transparent member 15 and is incident on the light-receiving surface of the solar cells 10.

The second protecting member 14 is used to protect the back surface of the solar cells 10. The second protecting member 14 is a weatherproof member such as weatherproof resin film or a multilayer film in which metal foil is interposed between a pair of resin films.

The sealing material 13 can be a sealing resin such as ethylene-vinyl acetate (EVA) or polyvinylbutyral (PVB).

The solar cells 10 are connected electrically by wiring members 11. More specifically, solar cells 10 arranged along the x-direction (a first direction) are connected electrically by wiring members 11 to create a solar cell string 2. A plurality of solar cell strings 2 are arrayed at intervals to each other along the y-direction (a second direction) intersecting the x-direction, and are connected to each other electrically. In this way, the solar cells 10 are connected electrically.

Each solar cell 10 has a photoelectric conversion unit 20. There are no particular restrictions on the photoelectric conversion unit 20 as long as carriers (electrons and holes) are generated by the received light. The photoelectric conversion unit 20 may be provided with a semiconductor substrate comprising semiconductor materials having of one type of conductivity, a semiconductor layer having the other type of conductivity arranged on one main surface of the substrate, and a semiconductor layer having the one type of conductivity arranged on the other main surface of the substrate. In this case, a substantially intrinsic semiconductor layer (i-type semiconductor layer) may be arranged between each semiconductor layer and the substrate at a thickness that does not substantially contribute to the generation of electricity. The photoelectric conversion unit 20 may also include a transparent conductive oxide (TCO) layer arranged on a semiconductor layer. The photoelectric conversion unit 20 may be a substrate having a p-type diffusion region on one main surface, and an n-type diffusion region on the other main surface.

The photoelectric conversion unit 20 has first and second main surfaces 20a and 20b. The first main surface 20a is the side on which the first protecting member 15 is arranged. The second main surface 20b is the side on which the second protecting member 14 is arranged. Therefore, there are cases in which the first main surface 20a is referred to as the light-receiving surface, and the second main surface 20b is referred to as the back surface.

An electrode 21 is arranged on the first main surface 20a of the photoelectric conversion unit 20. Another electrode 22 is arranged on the second main surface 20b of the photoelectric conversion unit 20. In order to reduce light-shielding loss, the area of electrode 21 is preferably smaller than the area of electrode 22. In order to reduce resistance loss, at least a portion of electrode 22 is thicker than electrode 21.

Electrode 21 has a plurality of finger portions 21a and at least one busbar portion 21b. Electrode 22 also has a plurality of finger portions 22a and at least one busbar portion 22b. Each of the finger portions 21a and 22a has a linear shape extending along the y-direction. The finger portions 21a and 22a are arranged at intervals from each other along the x-direction.

Busbar portion 21b extends along the x-direction and electrically connects the finger portions 21a. Busbar portion 22b also extends along the x-direction and electrically connects the finger portions 22a. There are no particular restrictions on the shape of the busbar portions 21b and 22b. However, in the present invention they have a linear shape and extend along the x-direction.

The wiring members 11 have an elongated shape extending longitudinally in the x-direction, and are used to electrically connect electrode 21 in one solar cell 10 to electrode 22 in another adjacent solar cell 10 in the x-direction. The wiring members 11 primarily connect the electrodes 21 and 22 electrically on the busbar portions 21b and 22b.

The wiring members 11 and the solar cells 10 are bonded together by an adhesive layer 12 obtained by curing a resin adhesive. The adhesive layer 12 may be obtained by curing a resin adhesive with insulating properties. In this case, the wiring members 11 are preferably fixed to the solar cells 10 so that at least a portion of the electrodes 21 and 22 comes into direct contact with the wiring members 11. The adhesive layer 12 may be a cured resin adhesive with insulating properties throughout which a conductive material has been dispersed. In this case, the wiring members 11 and the electrodes 21 and 22 may be connected electrically via direct contact or via the conductive material. When the adhesive layer includes a conductive material, the wiring members 11 and the electrodes 21 and 22 do not have to come into direct contact. Examples of conductive materials include metal particles and oxide particles or resin particles coated with a conductive film.

Figure 4:
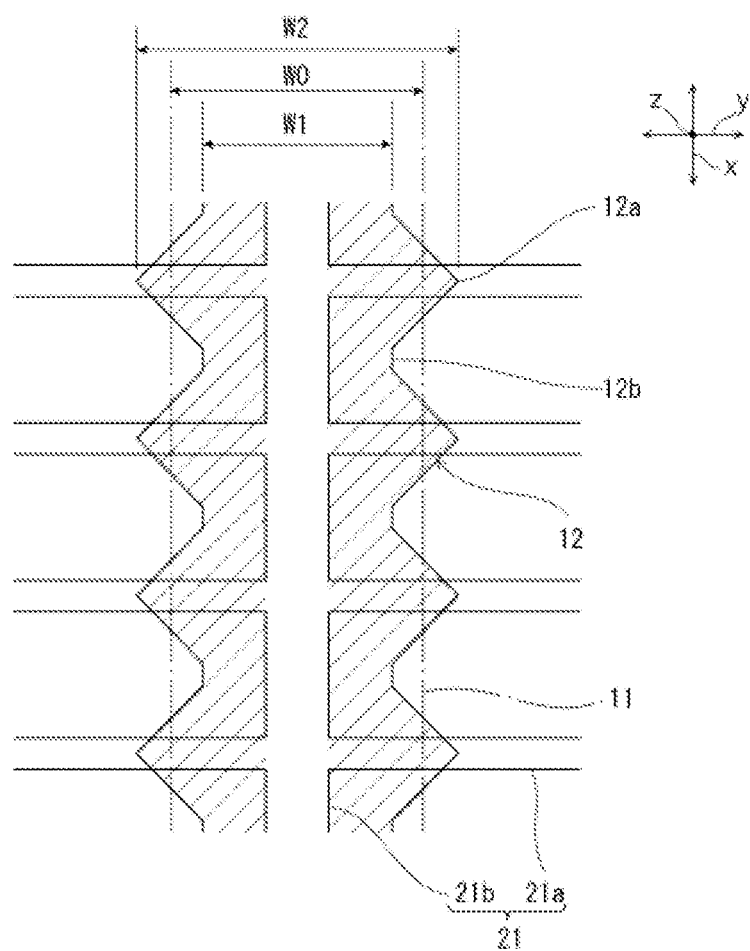
FIG. 4 is a simplified plan view in which section IV in FIG. 2 has been enlarged.
Figure 5:
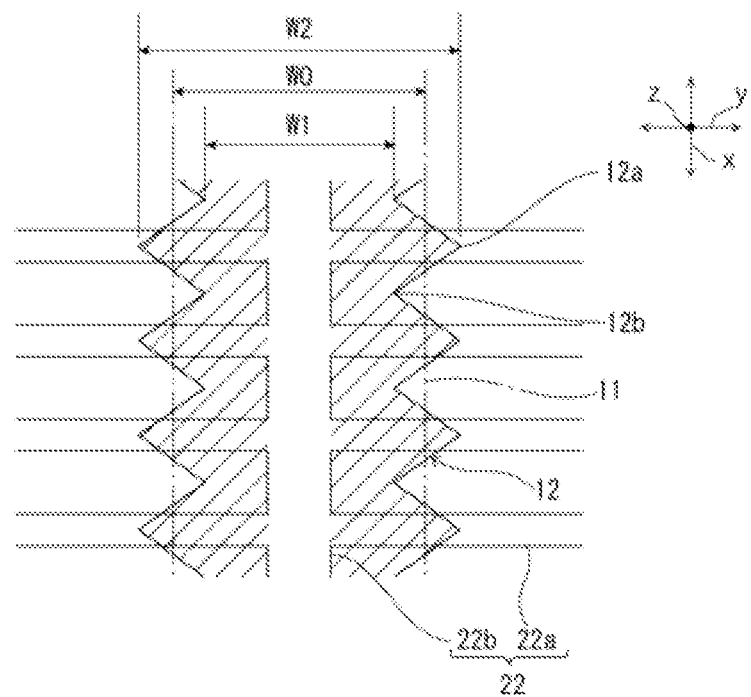
FIG. 5 is a simplified plan view in which section V in FIG. 3 has been enlarged.

As shown in FIG. 4 and FIG. 5, the adhesive layer 12 has wide portions 12a which are larger dimensionally in the width direction (the y-direction) intersecting the longitudinal direction of the wiring members 11 (x-direction), and narrow portions 12b which are smaller dimensionally in the width direction. More specifically, the adhesive layer 12 has a plurality of wide portions 12a and narrow portions 12b. The wide portions 12a and the narrow portions 12b are arranged alternately along the x-direction. The wide portions 12a are arranged so as to overlap with the finger portions 21a and 22a, and the narrow portions 12b are arranged between adjacent finger portions 21a and 22a.

The width W1 of the narrow portions 12b is smaller than the width W0 of the wiring members 11. The narrow portions 12b are positioned entirely between the wiring members 11 and the solar cells 10 in plan view (when viewed from a third direction (the z-direction) which is perpendicular to the first and second main surfaces 20a and 20b). Therefore, there is a region to the outside of the narrow portions 12b in the width direction in which a main surface of the photoelectric conversion unit 20 and the wiring members 11 face each other without the adhesive layer 12 coming between them.

The width W2 of the wide portions 12a is equal to or greater than the width W0 of the wiring members 11. In plan view, the wide portions 12a have a portion which protrudes from the wiring members 11.

Therefore, the wiring members 11 are bonded onto the photoelectric conversion unit 20 by the adhesive layer 12 over the entire portion in the width direction positioned above the wide portions 12a. The portion of the wiring members 11 positioned above the narrow portions 12b in the width direction is bonded onto the photoelectric conversion unit 20 by the adhesive layer 12, but the other portions are not bonded onto the photoelectric conversion unit 20. More specifically, the central portion of the wiring members 11 positioned above the narrow portions 12b in the width direction is bonded onto the photoelectric conversion unit 20 by the adhesive layer 12, and both end portions of same are not bonded onto the photoelectric conversion unit 20. Therefore, in the present embodiment, there are multiple locations in which a section of the wiring members 11 in the width direction is not bonded onto the photoelectric conversion unit 20, and these locations are distributed in the longitudinal direction of the wiring members 11 (the first direction or x-direction). In addition, locations in which the wiring members 11 are bonded onto the photoelectric conversion unit 20 in the entire width direction are also distributed in the longitudinal direction of the wiring members 11, and between said locations bonded onto the photoelectric conversion unit 20 in the entire width direction, there are locations that are not bonded onto the photoelectric conversion unit 20 in the width direction.

However, the thermal expansion coefficient of the wiring member is different from the thermal expansion coefficient of the solar cells. Therefore, when the temperature of the solar module changes, stress is applied between the wiring member and the solar cells. When this is repeated over long-term use, defects appear in the solar cells such as warping, breaking, and cracking, and the wiring member sometimes peels off.

However, as mentioned above, in the solar module 1 of the present embodiment, there are regions at least to the outside of the narrow portions 12b in which the wiring members 11 and surface of a solar cell 10 face each other without the adhesive layer 12 coming between them. In other words, there is a portion of the wiring members 11 in the width direction which is not bonded onto the photoelectric conversion unit 20 via the adhesive layer 12. Therefore, when the temperature of the solar module 1 changes and a difference in the amount of expansion or a difference in the amount of contraction occurs between the wiring member 11 and a solar cell 10, the portion of the wiring member 11 that is not bonded to the photoelectric conversion unit 20 functions as a stress-alleviating region, which can reduce the stress applied to the solar cells 10. As a result, the problems described above are suppressed in the solar cells 10.

In the solar module 1, there are several locations distributed in the longitudinal direction of the wiring members 11 (the x-direction) in which a section of the wiring members 11 is not bonded onto the photoelectric conversion unit 20 in the width direction. Therefore, warping and cracking of the solar cells 10 is even more effectively suppressed.

In addition, in the solar module 1, there are several locations distributed along the longitudinal direction of the wiring members 11 in which the wiring members 11 are bonded to the top of the photoelectric conversion unit 20 in the entire width direction, and there are locations between these in which the wiring member is not bonded onto the photoelectric conversion unit 20 in a portion in the width direction. Because there are several locations distributed in the longitudinal direction in which the wiring members 11 are bonded onto the photoelectric conversion unit 20 in the entire width direction, the total length of the portions in which the wiring members 11 are bonded onto the photoelectric conversion unit 20 entirely in the width direction can be reduced. This can also reduce the amount of stress applied to the solar cells 10. Because there are locations between the portions in which the wiring member is bonded to the top of the photoelectric conversion unit 20 in the entire width direction in which the wiring member is not bonded on top of the photoelectric conversion unit 20 in a section in the width direction, the reduced stress can be further alleviated. Therefore, warping and cracking of the solar cells 10 can be even more effectively suppressed.

In order to more effectively suppress warping and cracking of the solar cells 10, the width W1 of the narrow portions 12b should be 0.9 times the width W0 of the wiring member 11 or less, and more preferably 0.8 times or less. However, when the width W1 of the narrow portions 12b is too small, the adhesive strength of the wiring members 11 to the solar cells 10 is too low. Therefore, the width W1 of the narrow portions 12b is preferably 0.3 times the width W0 of the wiring member 11 or more, and more preferably 0.5 times or more.

However, when the temperature of the solar module 1 changes, the wiring member 11 expands and contracts relative to the solar cells 10 along the longitudinal direction (x-direction) of the wiring member 11. As a result, stress from the wiring member 11 is likely to cause the finger portions 21a and 22a extending in the y-direction which intersects the x-direction to peel off the photoelectric conversion unit 20.

However, in the present embodiment, the wide portions 12a in the adhesive layer 12 overlap with the finger portions 21a and 22a. Because the surface of the finger portions 21a and 22a is covered and fixed to the surface of the photoelectric conversion unit 20 by the adhesive layer 12, peeling of the finger portions 21a and 22a from the photoelectric conversion unit 20 is advantageously suppressed. In the present embodiment, the width W2 of the wide portions 12a arranged so as to overlap the finger portions 21a and 22a is greater than the width W0 of the wiring member 11, and the wide portions 12a have sections which protrude from the wiring member 11. As a result, the surface of the finger portions 21a and 22a in the portion positioned to the outside of the wiring member 11 is covered and fixed to the surface of the photoelectric conversion unit 20 by the adhesive layer 12, thereby increasing the bonding strength. Because the bonding strength of the finger portions 21a and 22a has been further increased, peeling from the photoelectric conversion unit 20 is more effectively suppressed. Because the adhesive layer 12 protrudes in the wide portions 12a in the width direction of the wiring member 11, bonded portions referred to as fillets are formed which extend from the side surface of the wiring member 11 to the surface of the photoelectric conversion unit 20. When fillets are formed, the bonding strength of the wiring member 11 is also increased.

In order to more effectively suppress peeling of the finger portions 21a and 22a from the photoelectric conversion unit 20, the width W2 of the wide portions 12a should be 1.0 times the width W0 of the wiring member 11 or more, and more preferably 1.1 times or more. However, when the width W2 of the wide portions 12a is too great, the area ratio of the portion of the photoelectric conversion unit 20 covered by the adhesive layer 12 increases relative to the portion not covered by the wiring member 11, and light-shielding loss caused by the adhesive layer 12 excessively reduces the light-receiving efficiency of the photoelectric conversion unit 20. When the adhesive layer 12 is colored or opaque, the light-receiving efficiency of the photoelectric conversion unit 20 is reduced even more. Therefore, the width W2 of the wide portions 12a is preferably 1.5 times the width of the wiring member 11 or less, and more preferably 1.2 times or less.

The following is an explanation of an example of a manufacturing method for this solar module 1.

First, a plurality of solar cells 10 are prepared. Next, the solar cells 10 are connected electrically using a wiring member 11. When the solar cells 10 are connected electrically using a wiring member 11, the solar cells 10 and the wiring member 11 are bonded using a resin adhesive. The resin adhesive is preferably a resin adhesive with anisotropic conductive properties. Next, the paste-like resin adhesive is applied with the wider shape at the finger portions 21a and with the narrower shape between adjacent finger portions 21a. Also, the paste-like resin adhesive is applied with the wider shape at the finger portions 22a and with the narrower shape between adjacent finger portions 22a. A wiring member 11 is arranged on the resin adhesive applied to both the first and second main surfaces 20a and 20b, and heat and relative pressure are applied to cure the resin adhesive and obtain an adhesive layer 12 with alternating wide portions 12a and narrow portions 12b. Alternatively, an adhesive layer 12 with alternating wide portions 12a and narrow portions 12b can be formed using a film-like resin adhesive molded beforehand into a predetermined shape. In order to make the manufacturing process simpler, a paste-like resin adhesive is preferably applied on a predetermined shape rather than using a film-like resin adhesive molded beforehand into a predetermined shape. The application regions can be easily controlled using a discharging means such as a dispenser.

Next, a resin sheet constituting a portion of the sealing material 13, a plurality of solar cells 10 connected electrically, a resin sheet constituting the remaining portion of the sealing material 13, and a second protecting member 14 are stacked in this order on a first protecting member 15, and then laminated to complete the solar module 1. As mentioned above, there is a region to the outside of the narrow portions 12b in the width direction in which the surface of the photoelectric conversion unit 20 and the wiring member 11 face each other without an adhesive layer 12 between them, but some material from the resin sheet softened during the lamination process enters at least a portion of this region. Because at least some of the resin material enters the region without an adhesive layer between the main surface of the photoelectric conversion unit 20 and the wiring member 11, the presence of air pockets in this region after modulization can be suppressed. As a result, moisture and impurities are kept from building up in this region, and the reliability of the solar module can be improved.

2nd Embodiment

The following is an explanation of another example of a preferred embodiment of the present invention. In the following explanation, members having functions substantially identical to those in the first embodiment are denoted by the same reference numbers and further explanation of these members has been omitted.

In the explanation of the example in the first embodiment, the width W2 of the wide portions 12a in the y-direction was greater than the width W0 of the wiring member 11, and the tips of the wide portions 12a protruded from the wiring member 11.

Figure 6:
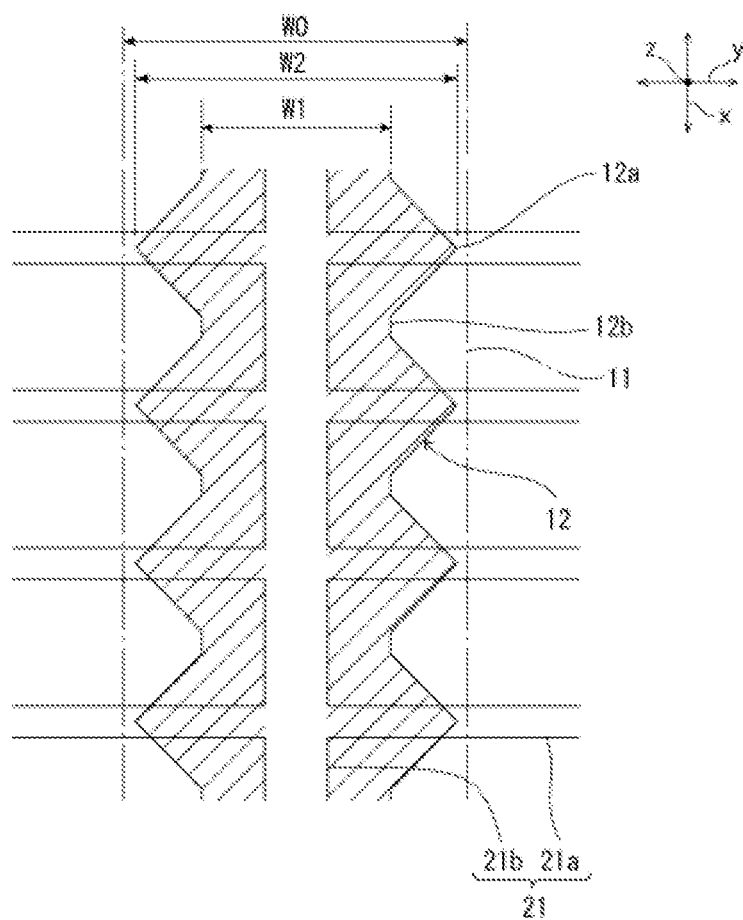
FIG. 6 is a simplified plan view in which a portion of a main surface of a solar cell in the second embodiment has been enlarged.

However, in the present embodiment, as shown in FIG. 6, the width W2 of the wide portions 12a is equal to or less than the width W0 of the wiring member 11, and the wide portions 12a are positioned entirely between the wiring member 11 and a solar cell 10. In the present embodiment, the locations in which the wiring member 11 is not bonded onto the photoelectric conversion unit 20 in the width direction are continuous in the longitudinal direction of the wiring member 11 (the first direction or x-direction). However, even in this case, as in the first embodiment, problems such as warping and cracking of solar cells 10 can be suppressed.

Also, because wide portions 12a are provided only below the wiring member 11, light which is incident on the portion of the first and second main surfaces 20a and 20b not covered by the wiring member 11 is not blocked by the adhesive layer 12. As a result, even better photoelectric conversion efficiency can be obtained.

Figure 7:
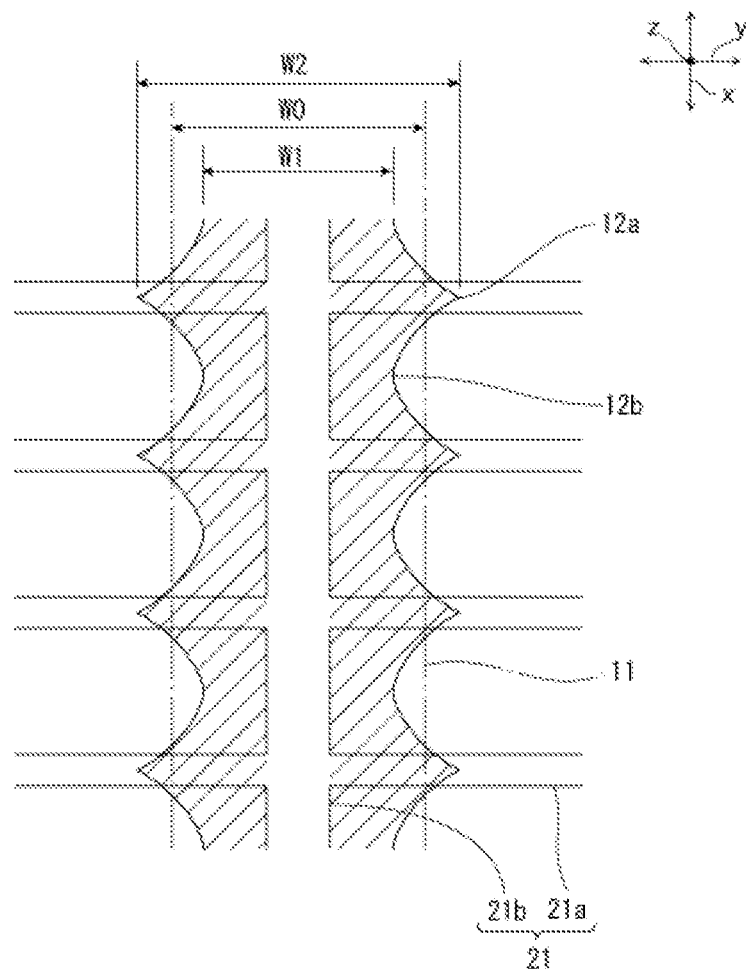
FIG. 7 is a simplified plan view in which a portion of a main surface of a solar cell in the third embodiment has been enlarged.

The present invention includes various embodiments not described in the first and second embodiments. For example, in the embodiments described above, the wide portions have a substantially triangular shape whose apex is in the portion overlapping with the finger portions. However, the shape of the wide portions is not limited to this. For example, in the third embodiment shown in FIG. 7, the wide portions 12a have a triangular shape whose oblique sides become recessed towards the center. In other words, the peripheral sides of the wide portions 12a and the narrow portions 12b may be curved. The wide portions may also be trapezoidal. A trapezoidal shape can increase the bonding strength to the finger portions.

In the first and second embodiments, the adhesive layer 12 has a symmetrical shape in the width direction, but the present invention is not limited to this shape. The adhesive layer may be asymmetrical yet still have wide portions 12a and narrow portions 12b.

The shape of the busbar portions does not have to be linear. It may also have a zigzag shape.

In addition, the electrodes in the solar cells may have a plurality of finger portions but no busbar portion.

Also, the wide portions and the narrow portions do not have to be arranged alternately along the one direction.

The present invention includes many other embodiments not described herein. Therefore, the technical scope of the present invention is defined solely by the items of the invention specified in the claims pertinent to the above explanation.

KEY TO THE DRAWINGS

1: Solar module
10: Solar cell
11: Wiring member
12: Adhesive layer
12a: Wide portion
12b: Narrow portion
20: Photoelectric conversion unit
20a: 1st main surface
20b: 2nd main surface
21, 22: Electrode
21a, 22a: Finger portion
21b, 22b: Busbar portion

What is claimed is:
1. A solar module comprising:
a solar cell including a photoelectric conversion body and an electrode provided on a main surface of the photoelectric conversion body,
a wiring member arranged on the main surface of the solar cell and electrically connected to the electrode, and
a resin adhesive layer arranged between the wiring member and the main surface of the solar cell, wherein
the resin adhesive layer has wide portions and narrow portions along a longitudinal direction of the wiring member, wherein a width of the narrow portions is narrower than a width of the wiring member such that the wiring member and the main surface of the solar cell face each other without interposing the resin adhesive layer in a region at least to the outside of the narrow portions, the wide portions include a fillet portion, resin of the fillet portion directly contacting both of a side surface of the wiring member and the main surface of the photoelectric conversion body, the electrode includes a plurality of finger portions extending along a direction intersecting the longitudinal direction of the wiring member, the wide portions are arranged so as to cover a surface of the plurality of finger portions, the solar module further comprises both a bonded region and an unbonded region in an area in which the wiring member overlaps with a space between adjacent finger portions of the plurality of finger portions, wherein in the bonded region one of the narrow portions of the resin adhesive layer is bonded to the main surface of the photoelectric conversion body, and in the unbonded region the resin adhesive layer is not bonded to the main surface of the photoelectric conversion body, wherein a width of the wide portions is wider than the width of the wiring member such that a part of the wide portions protrudes outwardly from the wiring member; and wherein a length of one wide portion of the wide portions in the longitudinal direction becomes smaller and extends to an apex as the one wide portion extends further away from the wiring member in the direction intersecting the longitudinal direction.

2. The solar module according to claim 1, wherein the wide portions and narrow portions are arranged so as to alternate in the longitudinal direction of the wiring member.

3. The solar module according to claim 1, wherein the electrode has a busbar portion extending in the longitudinal direction of the wiring member.

4. The solar module according to claim 1, wherein a sealing material comprising a sealing resin is further provided to seal the solar cell, the sealing material having a portion which enters at least a portion of the region to the outside of the narrow portions of the resin adhesive layer wherein the wiring member and the surface of the solar cell face each other without the interposing adhesive layer.

5. The solar module according to claim 1, wherein a length of the unbonded region in the longitudinal direction becomes larger as the unbonded region approaches an edge of the wiring member in the direction intersecting the longitudinal direction.

* * * * *